US012629702B2

(12) United States Patent (10) Patent No.: US 12,629,702 B2

Jang et al. (45) Date of Patent: May 19, 2026

(54) SHOWERHEAD ASSEMBLY AND SUBSTRATE PROCESSING APPARATUS

(71) Applicant: TES CO., LTD, Yongin-si (KR)

(72) Inventors: Kyung-Ho Jang, Yongin-si (KR); Byeong-Ho Yun, Yongin-si (KR); Min-Wook Kang, Yongin-si (KR)

(73) Assignee: TES CO., LTD, Yongin-si (KR)

( * ) Notice: Subject to any disclaimer, the term of this patent is extended or adjusted under 35 U.S.C. 154(b) by 476 days.

(21) Appl. No.: 18/227,279

(22) Filed: Jul. 27, 2023

(65) Prior Publication Data

US 2024/0042463 A1 Feb. 8, 2024

(30) Foreign Application Priority Data

Aug. 2, 2022 (KR) ........................ 10-2022-0095859

(51) Int. Cl.
B05B 1/00 (2006.01)
B05C 5/02 (2006.01)
C23C 16/455 (2006.01)

(52) U.S. Cl.
CPC ............ B05B 1/005 (2013.01); B05C 5/0225 (2013.01); B05C 5/0275 (2013.01); C23C 16/45565 (2013.01); C23C 16/4557 (2013.01)

(58) Field of Classification Search
CPC ........... B05B 1/005; B05B 1/16; B05B 12/14; C23C 16/4557; C23C 16/45565
See application file for complete search history.

(56) References Cited

U.S. PATENT DOCUMENTS

| | | | |
|---|---|---|---|
| 2004/0123800 A1* | 7/2004 | Schlottmann | C23C 16/455 |
| | | | 118/715 |
| 2005/0000423 A1* | 1/2005 | Kasai | H01J 37/3244 |
| | | | 257/E21.17 |
| 2016/0348242 A1* | 12/2016 | Sung | C23C 16/45565 |

FOREIGN PATENT DOCUMENTS

| | | |
|---|---|---|
| KR | 10-2006-0103287 A | 9/2006 |
| KR | 10-2020-0026305 A | 3/2020 |

* cited by examiner

*Primary Examiner* — Joseph A Miller, Jr.

(74) *Attorney, Agent, or Firm* — Park, Kim & Suh, LLC

(57) ABSTRACT

The present disclosure relates to a showerhead assembly and a substrate processing apparatus, and more particularly to a showerhead assembly and a substrate processing apparatus including a ceramic heater that heats a substrate and by which hole processing is freely performed in a relatively high temperature process.

15 Claims, 5 Drawing Sheets

SHOWERHEAD ASSEMBLY AND SUBSTRATE PROCESSING APPARATUS

CROSS-REFERENCE TO RELATED APPLICATIONS

This application claims the benefit of Korean Patent Application No. 10-2022-0095859, filed on Aug. 2, 2022, which is hereby incorporated by reference as if fully set forth herein.

TECHNICAL FIELD

The present disclosure relates to a showerhead assembly and a substrate processing apparatus, and more particularly to a showerhead assembly and a substrate processing apparatus including a ceramic heater that heats a substrate and by which hole processing is freely performed in a relatively high temperature process.

BACKGROUND

A conventional substrate processing apparatus deposits a thin film having a predetermined thickness on one surface of a substrate, for example, an upper surface of the substrate. In this case, like a 3d-Nand device, when thin films are stacked on a substrate in a plurality of layers, the substrate may be bowed.

When a bowing phenomenon of the substrate occurs, it may be difficult to perform a process at an accurate position of the substrate in a subsequent step, and it may be difficult to chuck the substrate. In particular, a substrate processing process is performed with very high precision, and the bowing phenomenon of the substrate may decrease the precision of the substrate processing process.

In order to alleviate or eliminate the aforementioned bowing phenomenon of the substrate, a technology of depositing a thin film on a lower surface of the substrate is currently developed.

As such, in order to deposit a thin film on the lower surface of the substrate, an edge of the substrate is supported and process gas is supplied from the lower surface of the substrate. Therefore, in this configuration, it is difficult to heat the substrate from a lower portion of the substrate when heating the substrate to correspond to a processing temperature of the substrate.

Conventionally, a metal heater is employed on an upper portion of a substrate. In this case, although hole processing for supply of process gas is free, there is a disadvantage in that it is difficult to cope with a high-temperature environment, such as damage to a welded portion, when the process temperature rises.

In addition, when a ceramic heater is used on an upper portion of a substrate to cope with a high-temperature process, this may be used in a high-temperature process, but it is disadvantageously difficult to process a hole for supplying process gas.

SUMMARY

The present disclosure is to provide a showerhead assembly and a substrate processing apparatus that easily supply a process gas even in a relatively high process in a showerhead assembly including a heater body made of a ceramic material heating a substrate at an upper portion of the substrate.

The present disclosure provides a showerhead assembly including a heater body configured to heat a substrate, including a plurality of supply holes supplying at least one process gas toward the substrate, and is made of ceramic, and a flow path plate unit provided at an upper portion of the heater body, including a supply flow path communicating with the plurality of supply holes, and made of ceramic, wherein the flow path plate unit includes n (n being a natural number equal to or greater than 1) flow path plates including a supply flow path communicating with the plurality of supply holes.

The flow path plate unit may include flow path plates, the number of which corresponds to the number of process gases supplied toward substrate.

The showerhead assembly may further include a lowermost flow path plate providing a first flow path of a first process gas between the lowermost flow path plate and the heater body.

The showerhead assembly may further include an uppermost flow path plate providing an $n^{th}$ flow path of an $n^{th}$ process gas between the uppermost flow path plate and a flow path plate located at a lower portion of the uppermost flow path plate.

A stem may be provided at a central portion of the heater body, and a plurality of through holes of a remaining process gas except for the first process gas may be formed in the lowermost flow path plate, and the through holes may communicate with the supply holes of the heater body and the lowermost flow path plate includes a first opening with a central portion through which the stem passes.

In this case, the first flow path may communicate with the first opening at a central portion of the lowermost flow path plate and communicate with an outside of the flow path plate unit at an edge of the lowermost flow path plate, and the first process gas may flow into the first flow path through the first opening and may be supplied downwardly at an edge of the heater body.

A stem may be provided at a central portion of the heater body, and an $n^{th}$ supply of the $n^{th}$ process gas disposed apart from the stem may be formed on the uppermost flow path plate, and an $n^{th}$ opening through which the stem passes may be formed in a central portion of the uppermost flow path plate.

The showerhead assembly may further include at least one intermediate flow path plate between the lowermost flow path plate and the uppermost flow path plate.

In this case, the intermediate flow path plate may provide a flow path between a flow path plate of a directly below and the intermediate flow path plate and includes a through hole through which a process gas of a flow path plate located at an upper portion provides.

A stem may be provided at a central portion of the heater body, an intermediate supply of a process gas of a corresponding intermediate flow path plate disposed apart from the stem may be formed on the intermediate flow path plate, and an opening through which the stem passes may be formed in a central portion of the intermediate flow path plate.

The $n^{th}$ supply or the intermediate supply may be made of ceramic, may protrude toward an upper portion, and may be connected to a lid of a chamber.

The showerhead assembly may further include an elastic pressurizer provided on the lid to elastically pressurize at least one of the $n^{th}$ supply or the intermediate supply toward the heater body.

The elastic pressurizer may include an upper fixing part connected to an upper end of at least one of the $n^{th}$ supply or the intermediate supply, a bellows disposed between the upper fixing part and an upper surface of the lid, and an elastic part pressurizing the upper fixing part downward.

An RF electrode for generating plasma may be formed inside or outside the heater body.

The present disclosure provides a substrate processing apparatus including a chamber providing a processing space in which a substrate is processed, a first showerhead assembly provided inside the chamber, having the substrate accommodated thereon, and supplying at least one or more lower process gases toward a lower surface of the substrate, and a second showerhead assembly provided at an upper portion of the substrate to heat the substrate and supplying at least one or more upper process gases toward an upper surface of the substrate, wherein the second showerhead assembly includes a heater body that heats the substrate, includes a plurality of supply holes through which at least one or more upper process gases are supplied toward the substrate, and is made of ceramic, and a flow path plate unit provided at an upper portion of the heater body, communicating with the plurality of supply holes, and made of ceramic.

According to the present disclosure having the aforementioned configuration, a heater body of a ceramic material heating a substrate at an upper portion of the substrate may be provided to easily perform a process even in a relatively high temperature process.

A flow path plate unit including a horizontal flow path and a vertical flow path may be provided on an upper surface of a heater body, and thus may effectively supply a process gas using a flow path plate of a ceramic material.

The flow path plate unit may be appropriately configured to adjust the number of flow path plates in response to a process condition of a substrate to have the flexibility of a design.

DETAILED DESCRIPTION

Hereinafter, the structure of a showerhead assembly according to an embodiment of the present disclosure will be described in detail with reference to the drawings.

Figure 1:
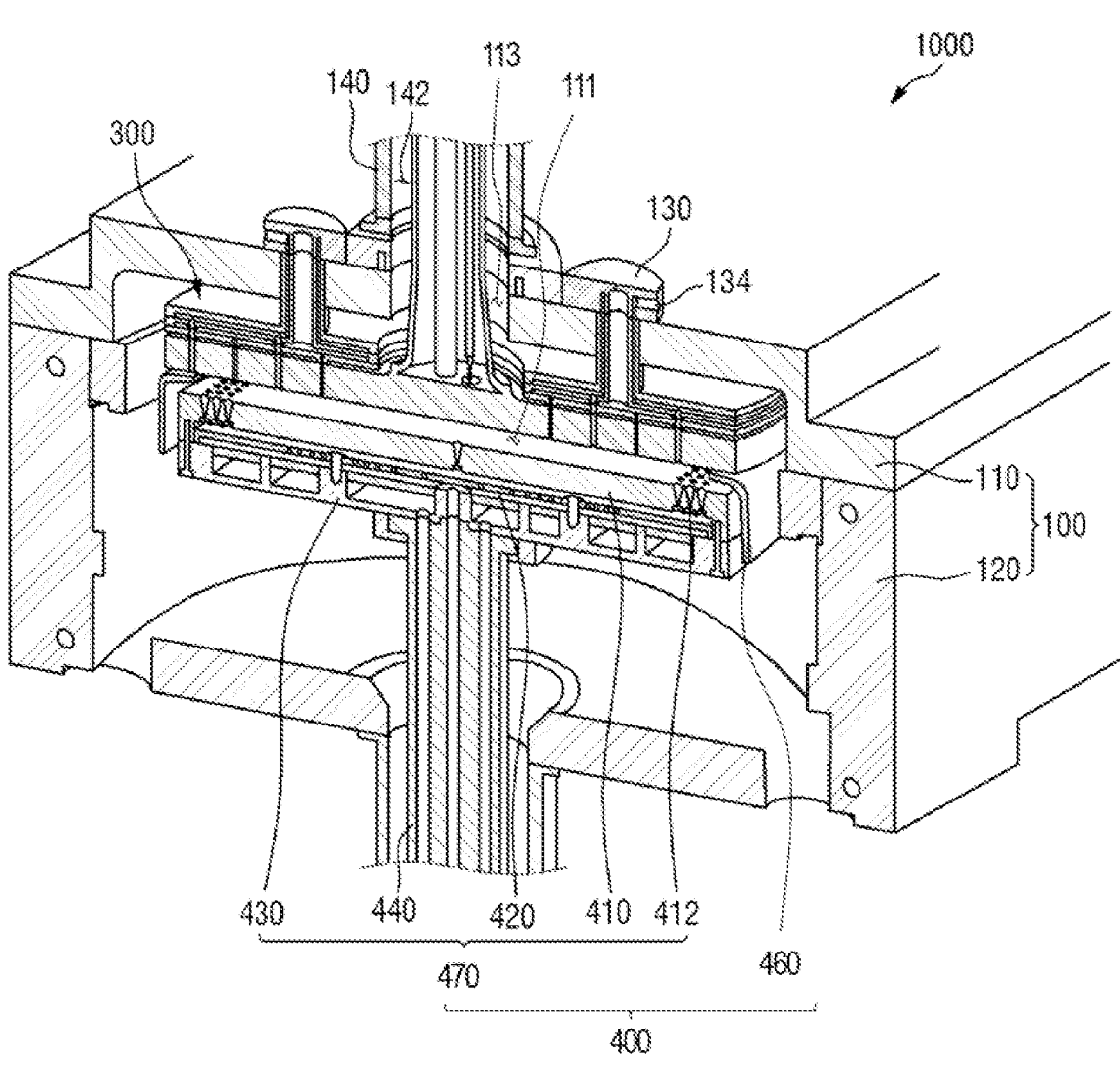
FIG. 1 is a cross-sectional perspective view showing a chamber of a substrate processing apparatus having a showerhead assembly according to an embodiment of the present disclosure.
Figure 2:
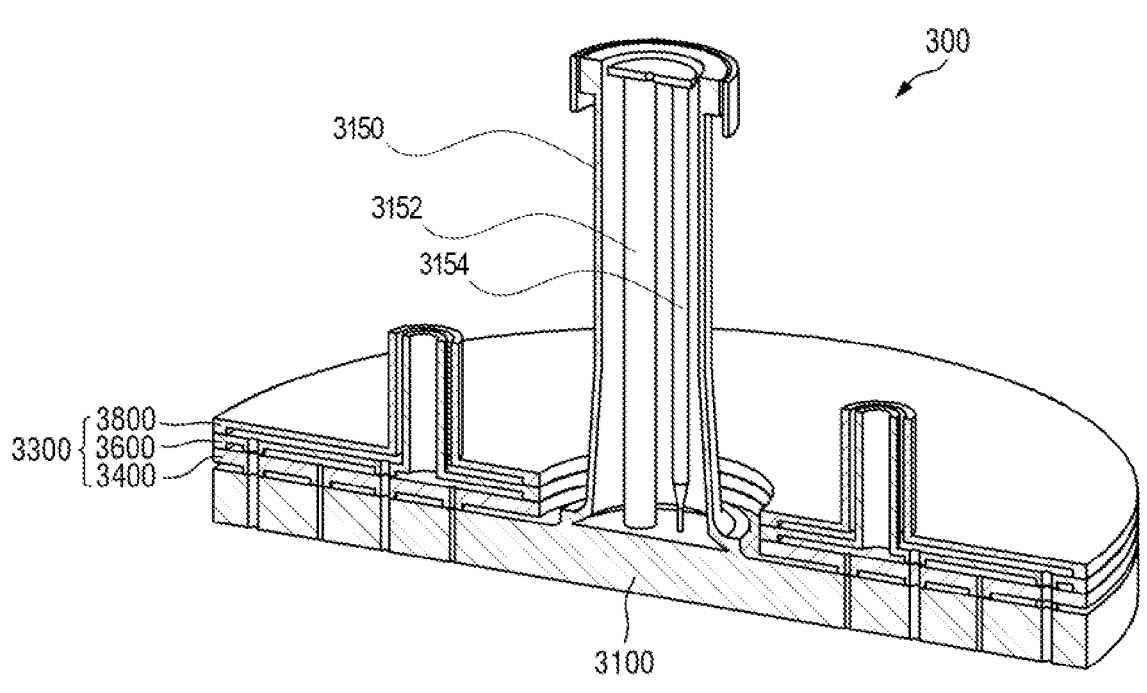
FIG. 2 is a cross-sectional perspective view showing a second showerhead assembly.

FIG. 1 is a cross-sectional perspective view showing a chamber 100 of a substrate processing apparatus 1000 having a showerhead assembly 300 according to an embodiment of the present disclosure, and FIG. 2 is a cross-sectional perspective view showing the showerhead assembly 300.

Referring to FIGS. 1 and 2, the substrate processing apparatus 1000 may include the chamber 100 that provides a processing space 111 in which a substrate (not shown) is processed, a first showerhead assembly 400 provided in the chamber 100, having the substrate accommodated thereon, and supplying at least one lower process gas toward a lower surface of the substrate, and the second showerhead assembly 300 provided on an upper portion of the substrate to heat the substrate and supplying at least one upper process gas toward an upper surface of the substrate.

The substrate processing apparatus 1000 according to the present disclosure may deposit a thin film by supplying a lower process gas to the lower surface of the substrate using the first showerhead assembly 400, and furthermore, may supply an upper process gas such as cleaning gas, purge gas, or curtain gas to the upper surface of the substrate using the second showerhead assembly 300.

First, the chamber 100 may provide the processing space 111 for processing the substrate inside. The chamber 100 may include a chamber body 120 having an open top and a lid 110 sealing the open top of the chamber body 120.

The first showerhead assembly 400 described above is provided in a lower portion of the inside of the chamber 100. The first showerhead assembly 400 may support the substrate and supply the aforementioned lower process gas to the lower surface of the substrate.

Specifically, the first showerhead assembly 400 may include a substrate support 460 supporting an edge of the substrate and a first showerhead 470 disposed inside the substrate support 460 and supplying the lower process gas toward the lower surface of the substrate.

The substrate support 460 supports an edge of the lower surface of the substrate such that a thin film may be deposited on the lower surface of the substrate.

The first showerhead 470 may include a first supply hole 412 supplying the lower process gas toward the substrate and a support bar 440 extending downward. A supply flow path (not shown) through which the lower process gas is supplied may be formed through the inside of the support bar 440. That is, the lower process gas supplied through the supply flow path is supplied toward the lower surface of the substrate through the first supply hole 412.

For example, the first showerhead 470 includes a lower plate 430 connected to the support bar 440, a blocking plate 420 located on an upper portion of the lower plate 430, and a facing plate 410 that is located on an upper portion of the blocking plate 420 and in which the first supply hole 412 is formed.

The lower process gas may be uniformly distributed from the blocking plate 420 through the lower plate 430 and supplied through the first supply hole 412 of the facing plate 410.

The structure of the first showerhead 470 is only described as an example and may be appropriately modified.

As described above, in order to deposit a thin film on the lower surface of the substrate, the edge of the substrate is supported by the substrate support 460, and a process gas is supplied from the lower surface of the substrate. Therefore, in this configuration, when heating the substrate to adjust a process temperature for the substrate, it is difficult to heat the substrate from the lower portion of the substrate.

Therefore, in the present disclosure, the second showerhead assembly 300 is provided on the upper portion of the substrate to heat the substrate and supply at least one upper process gas toward the upper surface of the substrate. In addition, the second showerhead assembly 300 may supply purge gas, curtain gas, cleaning gas or the like toward the upper surface of the substrate.

However, conventionally, a metal heater is employed on the upper portion of the substrate. In this case, hole processing for supply of process gas is free, but there is a disadvantage that it is difficult to cope with a high-temperature environment when the process temperature rises.

When a ceramic heater is used on the upper portion of the substrate to cope with the high temperature process, this may be used in the high temperature process, but it has a disadvantage that it is difficult to process a hole for supplying the process gas.

In order to resolve this problem, the present disclosure provides the second showerhead assembly 300 to be used even in a high-temperature process of depositing a thin film on the lower surface of the substrate.

Figure 3:
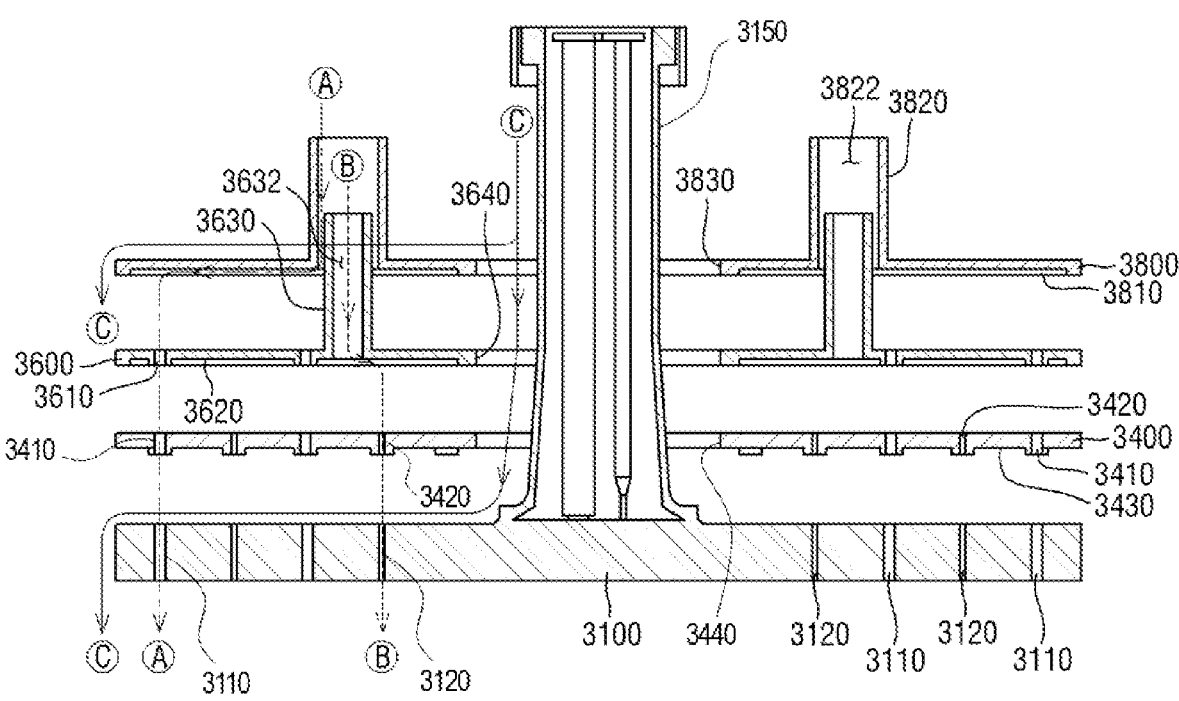
FIG. 3 is an exploded front view of a second showerhead assembly.
Figure 4:
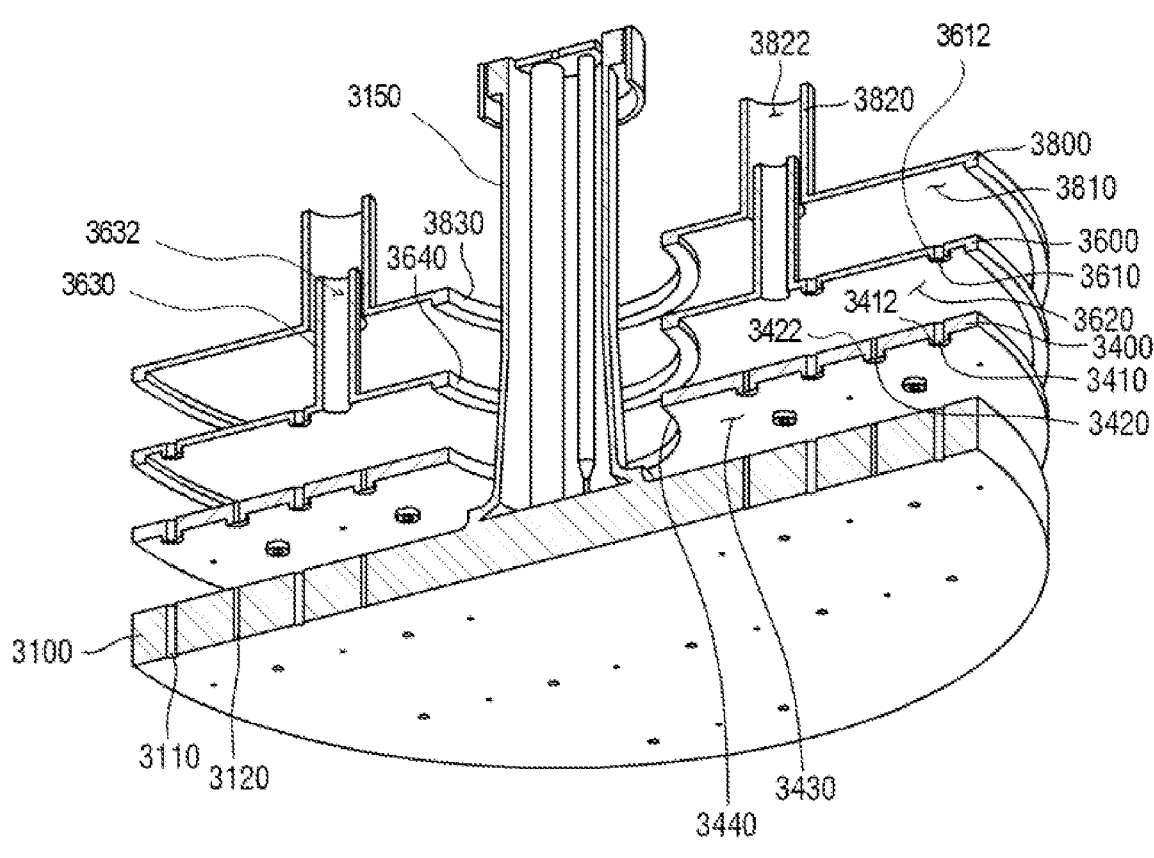
FIG. 4 is a lower exploded perspective view of a second showerhead assembly.

FIG. 2 is an assembly perspective view of the second showerhead assembly 300, FIG. 3 is an exploded front view of the second showerhead assembly 300, and FIG. 4 is a lower exploded perspective view of the second showerhead assembly 300.

Referring to FIGS. 2 to 4, the second showerhead assembly 300 may include a heater body 3100 that heats the substrate, includes a plurality of supply holes 3110 and 3120 formed therein to supply at least one upper process gas toward the substrate, and is made of ceramic, and a flow path plate unit 3300 that is formed on an upper portion of the heater body 3100, includes a supply flow path communicating with the plurality of supply holes 3110 and 3120, and is made of ceramic.

The heater body 3100 may be made of ceramic to cope with a high-temperature process environment. The plurality of supply holes 3110 and 3120 may be formed in the heater body 3100 to supply an upper process gas toward the upper portion of the substrate. The supply holes 3110 and 3120 may pass through the heater body 3100 and be formed in a vertical direction.

As described above, it is very difficult to form a hole for forming a process gas flow path in the heater body 3100 made of ceramic, in particular, a hole in a horizontal direction inside the heater body 3100.

Therefore, in the present disclosure, the flow path plate unit 3300 may be provided to provide a supply flow path through which the process gas is supplied to the upper portion of the heater body 3100.

That is, the flow path plate unit 3300 may include at least one or more flow path plates 3400, 3600, and 3800 in which a supply flow path communicating with the plurality of supply holes 3110 and 3120 is formed.

Each of the flow path plates 3400, 3600, and 3800 are made of ceramic and provide a horizontal and/or vertical supply flow path through which the process gas flows.

In this case, the flow path plate unit 3300 may include the flow path plates 3400, 3600, and 3800, the number of which corresponds to the number of upper process gases supplied toward the substrate. For example, one flow path plate may be provided when one process gas is supplied, and three flow path plates may be provided when three process gases are supplied. In addition, when a plurality of flow path plates are used for general use, it may be possible to supply a smaller number of process gases than flow path plates, needless to say.

For example, the flow path plate unit 3300 may include n (n being a natural number equal to or greater than 1) of the flow path plates 3400, 3600, and 3800.

In the following drawings, it is assumed that three of the flow path plates 3400, 3600, and 3800 are provided, but as described above, the number of the flow path plates 3400, 3600, and 3800 is only an example, and the number of flow path plates may be less than 3 or more than 3.

First, the flow path plate unit 3300 may include a lowermost flow path plate (or 'first flow path plate') 3400 providing a first flow path 3430 of a first process gas between the flow path plate unit 3300 and the heater body 3100.

The flow path plate unit 3300 may include an uppermost flow path plate (or '$n^{th}$ flow path plate') 3800 providing an $n^{th}$ flow path 3810 of an $n^{th}$ process gas, which defines the supply flow path between the uppermost flow path plate 3800 and the flow path plate 3600 positioned at a lower portion of the uppermost flow path plate 3800.

The flow path plate unit 3300 may further include at least one intermediate flow path plate 3600 between the lowermost flow path plate 3400 and the uppermost flow path plate 3800.

The lowermost flow path plate 3400 may be accommodated on an upper surface of the heater body 3100 and may include through holes 3410 and 3420 of the remaining process gas except for the first process gas.

That is, in the lowermost flow path plate 3400, the through holes 3410 and 3420 of process gases supplied through other flow path plates 3600 and 3800 positioned at an upper portion. The through holes 3410 and 3420 may communicate with the supply holes 3110 and 3120 formed in the heater body 3100.

For example, as shown in the drawing, when the three flow path plates 3400, 3600, and 3800 are provided, the through holes 3410 and 3420 may include a first through hole 3410 through which the process gas of the uppermost flow path plate 3800 passes and a second through hole 3420 through which the process gas of the intermediate flow path plate 3600 passes.

Thus, the process gas supplied through other flow path plates 3600 and 3800 located at the upper portion may be supplied to the substrate at a lower portion through the supply holes 3110 and 3120 of the heater body 3100 through the through holes 3410 and 3420 of the lowermost flow path plate 3400.

The first flow path 3430 of the first process gas may be provided in the lowermost flow path plate 3400. The first flow path 3430 may be formed on a lower surface of the lowermost flow path plate 3400.

For example, protrusions 3412 and 3422 (refer to FIG. 4) defining the aforementioned through holes 3410 and 3420 may protrude downward from the lower surface of the lowermost flow path plate 3400, and the remaining region of the protrusions 3412 and 3422 may define the first flow path 3430.

A stem 3150 protruding toward the upper portion may be formed on the heater body 3100, and a lid opening 113 (refer to FIG. 1) through which the stem 3150 passes may be formed in the lid 110 of the chamber 100.

An RF load 3152 applying RF power to the heater body 3100 when a process using plasma for the substrate is performed, and a detector 3154 detecting a temperature of the heater body 3100 may be connected to the inside of the stem 3150.

In the above configuration, a first opening 3440 through which the stem 3150 passes may be formed at a central portion of the lowermost flow path plate 3400. Although not shown, an RF electrode (not shown) connected to the RF load 3152 may be provided inside or outside the heater body 3100.

The first flow path 3430 of the lowermost flow path plate 3400 may communicate with the first opening 3440 at the center of the lowermost flow path plate 3400 and communicate with the outside of the flow path plate unit 3300 at an edge of the lowermost flow path plate 3400.

In the above configuration, the first process gas may flow into the first flow path 3430 through the first opening 3440. That is, the first process gas may be supplied through openings 3640 and 3830 and the first opening 3440 of the other flow path plates 3600 and 3800 located at the upper portion. The first process gas supplied in this way may be supplied to the first flow path 3430 through the first opening 3440, and may be supplied from the edge of the heater body 3100 toward a lower portion (path C in FIG. 3). Since the first process gas is supplied downwardly from the edge of the heater body 3100, the first process gas may serve as a so-called 'curtain gas'.

An $n^{th}$ supply 3820 of the $n^{th}$ process gas disposed apart from the stem 3150 described above may be formed on the uppermost flow path plate 3800.

The $n^{th}$ supply 3820 may provide a flow path 3822 that protrudes from the uppermost flow path plate 3800 toward the upper portion and through which a process gas passes therein.

The $n^{th}$ supply 3820 may communicate with the $n^{th}$ flow path 3810 of the uppermost flow path plate 3800.

In this case, the $n^{th}$ flow path 3810 may be provided in a lower surface of the uppermost flow path plate 3800. For example, the $n^{th}$ flow path 3810 may be provided in the form of a recess formed on the lower surface of the uppermost flow path plate 3800.

Since the uppermost flow path plate 3800 corresponds to a flow path plate located in the uppermost portion of the flow path plate unit 3300, a through hole is not formed in the uppermost flow path plate 3800.

An $n^{th}$ opening 3830 through which the stem 3150 passes may be formed at the center of the uppermost flow path plate 3800. In this case, as described above, the process gas of the lowermost flow path plate 3400 may be supplied to the lower portion through the $n^{th}$ opening 3830.

An intermediate supply 3630 of a process gas disposed apart from the stem 3150 described above may also be formed on the intermediate flow path plate 3600.

The intermediate supply 3630 may provide a flow path 3632 that protrudes toward the upper portion from the intermediate flow path plate 3600 and through which a process gas passes therein. In this case, the intermediate supply 3630 may be disposed inside the $n^{th}$ supply 3820 described above. That is, the intermediate supply 3630 is disposed concentrically with the $n^{th}$ supply 3820 and disposed inside the $n^{th}$ supply 3820 to reduce an installation space.

The intermediate supply 3630 may communicate with an intermediate flow path 3620 of the intermediate flow path plate 3600.

In this case, the intermediate flow path 3620 may be provided on a lower surface of the intermediate flow path plate 3600. For example, the intermediate flow path 3620 may be provided in the form of a recess formed on the lower surface of the intermediate flow path plate 3600.

Furthermore, a third through hole 3610 through which a process gas of the uppermost flow path plate 3800 located at the upper portion passes may be formed in the intermediate flow path plate 3600. In this case, a protrusion 3612 defining the third through hole 3610 may be provided on the lower surface of the intermediate flow path plate 3600, and the remaining region except for the protrusion 3612 may constitute the intermediate flow path 3620.

An intermediate opening 3640 through which the stem 3150 passes may be formed at a central portion of the intermediate flow path plate 3600. In this case, as described above, the process gas of the lowermost flow path plate 3400 may be supplied to a lower portion through the intermediate opening 3640.

The $n^{th}$ supply 3820 or the intermediate supply 3630 described above may be made of ceramic and protrude toward the upper portion. In this case, an upper end of the $n^{th}$ supply 3820 or the intermediate supply 3630 may be connected to the lid 110 of the chamber 100.

In this case, the upper end of the $n^{th}$ supply 3820 and the intermediate supply 3630 may pass through the lid 110 and may be connected to a head 130. A supply inlet 134 into which a process gas flows may be formed in the head 130.

For example, process gas supplied through the intermediate supply 3630 may be supplied through the supply inlet 134.

The $n^{th}$ process gas supplied to the $n^{th}$ supply 3820 may be supplied through another supply inlet (not shown) formed in the head 130.

The flow path plate unit 3300 described above is provided in the upper portion of the heater body 3100, and due to a change in process conditions such as temperature and pressure inside the chamber 100, a gap may be generated between the flow path plate unit 3300 and the heater body 3100. As such, when the gap is generated between the flow path plate unit 3300 and the heater body 3100, the process gas supplied through the flow path plate unit 3300 may leak.

Figure 5:
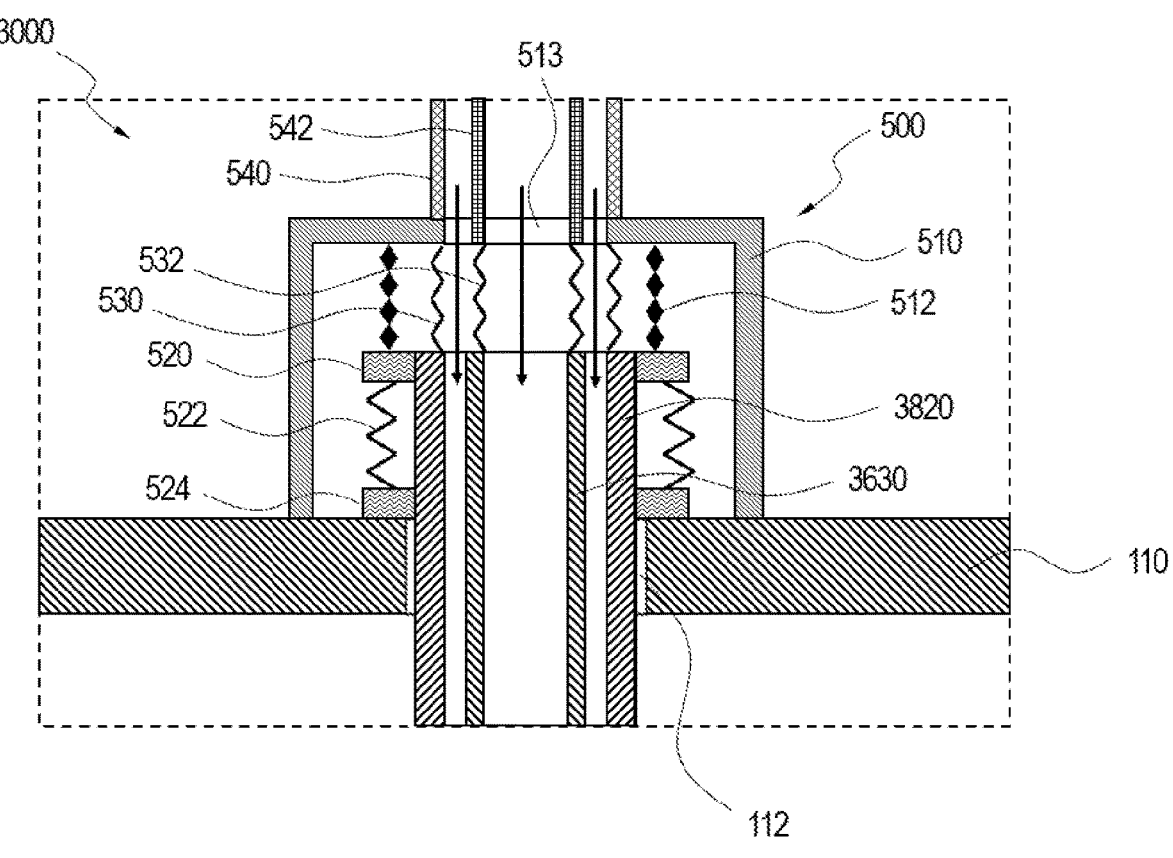
FIG. 5 is a cross-sectional view showing a part of a showerhead assembly according to another embodiment.

FIG. 5 shows a portion of a showerhead assembly 3000 according to another embodiment to resolve the aforementioned problem.

The showerhead assembly 3000 according to the present embodiment may include an elastic pressurizer 500 provided on the lid 110 to elastically pressurize at least one of the $n^{th}$ supply 3820 or the intermediate supply 3630 toward the heater body 3100.

The elastic pressurizer 500 pressurizes the flow path plate unit 3300 toward the heater body 3100 through the $n^{th}$ supply 3820 or the intermediate supply 3630 to prevent a gap from being formed between the flow path plate unit 3300 and the heater body 3100. Here, the meaning of 'elastically pressurizing' may be interpreted as allowing fine vertical movement of the flow path plate unit 3300 even while pressurizing the flow path plate unit 3300 downward by the elastic pressurizer 500.

For example, when the heater body 3100 thermally expands, the heater body 3100 may expand in a vertical direction. If the flow path plate unit 3300 continues to pressurize downward when the heater body 3100 expands in a vertical direction, damage may occur to the flow path plate unit 3300 or the heater body 3100. In order to prevent this, in the present disclosure, the flow path plate unit 3300 is elastically pressurized by the elastic pressurizer 500.

The configuration of the elastic pressurizer 500 may be implemented in various ways. For example, the elastic pressurizer 500 may include an upper fixing part 520 connected to an upper end of at least one of the $n^{th}$ supply 3820 or the intermediate supply 3630, a bellows 522 disposed between the upper fixing part 520 and an upper surface of the lid 110, and an elastic part 512 pressurizing the upper fixing part 520 downward.

The upper fixing part 520 is connected to an upper end of at least one of the $n^{th}$ supply 3820 or the intermediate supply 3630 to move up and down together. For example, the upper fixing part 520 may be connected to both upper ends of the $n^{th}$ supply 3820 and the intermediate supply 3630.

In this case, an upper end of the bellows 522 may be connected to the upper fixing part 520, and a lower end of the bellows 522 may be connected to the lid 110 or lower fixing part 524 as shown in the drawing.

The elastic part 512 may include a spring or the like to pressurize the upper fixing part 520 downward in a direction toward the heater body 3100. In this case, a housing 510 may be provided on the upper surface of the lid 110, and the elastic part 512 may be disposed inside the housing 510. That is, both ends of the elastic part 512 may be connected to an inner surface of the housing 510 and the upper fixing part 520, respectively. A supply inlet 513 into which a process gas is supplied may be formed in the housing 510.

Different process gases may be supplied through the n$^{th}$ supply 3820 and the intermediate supply 3630. Thus, in order to distinguish the n$^{th}$ supply 3820 and the intermediate supply 3630, a first connection bellows 530 connecting the n$^{th}$ supply 3820 and an outside supply flow path 540, and a second connection bellows 532 connecting the intermediate supply 3630 and an outside supply flow path 542 may be further provided.

The first connection bellows 530 and the second connection bellows 532 may be provided to prevent a process gas from leaking when the n$^{th}$ supply 3820 and the intermediate supply 3630 move up and down.

Hereinafter, a supply path of each process gas will be described with reference to FIG. 3.

First, a supply path of a process gas supplied through a flow path 3822 of the n$^{th}$ supply 3820 of the uppermost flow path plate 3800 is indicated by a 'path A' in the drawing.

That is, the process gas supplied through the n$^{th}$ supply 3820 of the uppermost flow path plate 3800 may be distributed to the n$^{th}$ flow path 3810 from a lower portion of the n$^{th}$ supply 3820. Then, the process gas may be supplied toward the substrate at the lower portion through the third through hole 3610 of the intermediate flow path plate 3600 located at a lower portion, the first through hole 3410 of the lowermost flow path plate 3400, and a first supply hole 3110 of the heater body 3100.

A supply path of the process gas supplied through the intermediate supply 3630 of the intermediate flow path plate 3600 may be indicated by a 'path B' in the drawing.

That is, the process gas supplied through the intermediate supply 3630 of the intermediate flow path plate 3600 may be distributed to the intermediate flow path 3620 from a lower end of the intermediate supply 3630. Then, the process gas may be supplied toward the substrate at the lower portion through the second through hole 3420 of the lowermost flow path plate 3400 located at the lower portion and a second supply hole 3120 of the heater body 3100.

Furthermore, a supply path of the first process gas of the lowermost flow path plate 3400 is indicated by a 'path C' in the drawing.

That is, the first process gas of the lowermost flow path plate 3400 may be supplied through the n$^{th}$ opening 3830 of the uppermost flow path plate 3800 described above. In detail, the first process gas may be supplied through a space between the n$^{th}$ opening 3830 and the stem 3150.

The n$^{th}$ process gas supplied through the n$^{th}$ opening 3830 may be supplied to the first opening 3440 of the lowermost flow path plate 3400 at the lower portion through the intermediate opening 3640 of the intermediate flow path plate 3600. Then, the first process gas may flow into the first flow path 3430 through the first opening 3440. The first process gas supplied as such may be supplied downwardly from the edge of the heater body 3100.

In the above configuration, the n$^{th}$ process gas may correspond to a purge gas composed of Ar, N$_2$, or the like and the process gas supplied through the intermediate flow path plate 3600 may correspond to a cleaning gas such as NF$_3$. In addition, the first process gas may correspond to curtain gas composed of inert gas. A type and role of the process gas is only described as an example and may be appropriately modified.

Although the present disclosure has been described with reference to an exemplary embodiment, those skilled in the art may make various modifications and changes within the scope without departing from the spirit and the scope of the present disclosure described in the claims described below. Therefore, when the modified implementation basically includes the elements of the claims of the present disclosure, the modified implementation needs to be considered as being included in the technical scope of the present disclosure.

What is claimed is:

1. A showerhead assembly comprising:
a heater body configured to heat a substrate and made of ceramic, including a plurality of supply holes supplying at least one process gas toward the substrate; and
a flow path plate unit provided at an upper portion of the heater body and made of ceramic, including a supply flow path communicating with the plurality of supply holes;
wherein the flow path plate unit includes n flow path plates including a supply flow path communicating with the plurality of supply holes and n is a natural number equal to or greater than 2,
wherein the n flow path plates include:
a lowermost flow path plate providing a first flow path of a first process gas, wherein the first flow path is formed between the lowermost flow path plate and the heater body; and
an uppermost flow path plate providing an n$^{th}$ flow path of an n$^{th}$ process gas between the uppermost flow path plate and a flow path plate located at a lower portion of the uppermost flow path plate,
wherein a stem is provided at a central portion of the heater body,
wherein a plurality of through holes of a remaining process gas except for the first process gas are formed in the lowermost flow path plate, and the through holes communicate with the supply holes of the heater body and the lowermost flow path plate includes a first opening with a central portion through which the stem passes,
wherein the first flow path communicates with the first opening at a central portion of the lowermost flow path plate and communicates with an outside of the flow path plate unit at an edge of the lowermost flow path plate,
wherein the first process gas flows into the first flow path through the first opening and is supplied downwardly at an edge of the heater body.

2. The showerhead assembly of claim 1, wherein the flow path plate unit includes flow path plates, the number of which corresponds to the number of process gases supplied toward the substrate.

3. The showerhead assembly of claim 1, wherein:
an n$^{th}$ supply of the n$^{th}$ process gas disposed apart from the stem is formed on the uppermost flow path plate, and an n$^{th}$ opening through which the stem passes is formed in a central portion of the uppermost flow path plate.

4. The showerhead assembly of claim 1, wherein the flow path plate unit further includes at least one intermediate flow path plate between the lowermost flow path plate and the uppermost flow path plate.

5. The showerhead assembly of claim 4, wherein the intermediate flow path plate provides a flow path between a flow path plate directly below and the intermediate flow path plate and includes a through hole through which a process gas of a flow path plate located at an upper portion provides.

6. The showerhead assembly of claim 4, wherein:

an intermediate supply of a process gas of a corresponding intermediate flow path plate disposed apart from the stem is formed on the intermediate flow path plate; and an opening through which the stem passes is formed in a central portion of the intermediate flow path plate.

7. The showerhead assembly of claim 3, wherein the $n^{th}$ supply is made of ceramic, protrudes toward an upper portion, and is connected to a lid of a chamber.

8. The showerhead assembly of claim 7, further comprising:

a pressurizer provided on the lid to pressurize the $n^{th}$ supply toward the heater body.

9. The showerhead assembly of claim 8, wherein the pressurizer includes:

an upper fixing part connected to an upper end of the $n^{th}$ supply;

a bellows disposed between the upper fixing part and an upper surface of the lid; and an elastic part pressurizing the upper fixing part downward.

10. The showerhead assembly of claim 6, wherein the intermediate supply is made of ceramic, protrudes toward an upper portion, and is connected to a lid of a chamber.

11. The showerhead assembly of claim 10, further comprising:

a pressurizer provided on the lid to pressurize the intermediate supply toward the heater body.

12. The showerhead assembly of claim 11, wherein the pressurizer includes:

an upper fixing part connected to an upper end of the intermediate supply;

a bellows disposed between the upper fixing part and an upper surface of the lid; and an elastic part pressurizing the upper fixing part downward.

13. The showerhead assembly of claim 1, wherein an RF electrode for generating plasma is configured inside or outside the heater body.

14. A showerhead assembly comprising:

a heater body configured to heat a substrate and made of ceramic, including a plurality of supply holes supplying at least one process gas toward the substrate; and a flow path plate unit provided at an upper portion of the heater body and made of ceramic, including a supply flow path communicating with the plurality of supply holes;

wherein the flow path plate unit includes n flow path plates including a supply flow path communicating with the plurality of supply holes and n is a natural number equal to or greater than 2, wherein the n flow path plates include:

a lowermost flow path plate providing a first flow path of a first process gas, wherein the first flow path is formed between the lowermost flow path plate and the heater body; and an uppermost flow path plate providing an $n^{th}$ flow path of an $n^{th}$ process gas between the uppermost flow path plate and a flow path plate located at a lower portion of the uppermost flow path plate, wherein the flow path plate unit further includes at least one intermediate flow path plate between the lowermost flow path plate and the uppermost flow path plate, wherein the intermediate flow path plate provides a flow path between a flow path plate directly below and the intermediate flow path plate and includes a through hole through which a process gas of a flow path plate located at an upper portion provides.

15. A showerhead assembly comprising:

a heater body configured to heat a substrate and made of ceramic, including a plurality of supply holes supplying at least one process gas toward the substrate; and a flow path plate unit provided at an upper portion of the heater body and made of ceramic, including a supply flow path communicating with the plurality of supply holes;

wherein the flow path plate unit includes n flow path plates including a supply flow path communicating with the plurality of supply holes and n is a natural number equal to or greater than 2, wherein the n flow path plates include:

a lowermost flow path plate providing a first flow path of a first process gas, wherein the first flow path is formed between the lowermost flow path plate and the heater body; and an uppermost flow path plate providing an $n^{th}$ flow path of an $n^{th}$ process gas between the uppermost flow path plate and a flow path plate located at a lower portion of the uppermost flow path plate, wherein the flow path plate unit further includes at least one intermediate flow path plate between the lowermost flow path plate and the uppermost flow path plate, wherein a stem is provided at a central portion of the heater body, wherein an intermediate supply of a process gas of a corresponding intermediate flow path plate disposed apart from the stem is formed on the intermediate flow path plate, wherein an opening through which the stem passes is formed in a central portion of the intermediate flow path plate.

* * * * *